United States Patent
Yin et al.

(10) Patent No.: US 9,168,658 B2
(45) Date of Patent: Oct. 27, 2015

(54) PANEL PICKUP AND PLACING METHOD AND COMBINED PICKUP DEVICE FOR PERFORMING THE METHOD

(75) Inventors: Fengming Yin, Guangdong (CN); Wenpin Chiang, Guangdong (CN); Chonghui Yin, Guangdong (CN)

(73) Assignee: SHENZHEN CHINA STAR OPTOELECTRONICS TECHNOLOGY CO., LTD., Shenzhen, Guangdong Province (CN)

( * ) Notice: Subject to any disclaimer, the term of this patent is extended or adjusted under 35 U.S.C. 154(b) by 820 days.

(21) Appl. No.: 13/381,940

(22) PCT Filed: Dec. 5, 2011

(86) PCT No.: PCT/CN2011/083467
§ 371 (c)(1), (2), (4) Date: Dec. 31, 2011

(87) PCT Pub. No.: WO2013/078705
PCT Pub. Date: Jun. 6, 2013

(65) Prior Publication Data
US 2013/0142613 A1  Jun. 6, 2013

(30) Foreign Application Priority Data
Dec. 2, 2011 (CN) .......................... 2011 1 0396121

(51) Int. Cl.
*H01L 21/673* (2006.01)
*B25J 15/06* (2006.01)
*B65G 49/06* (2006.01)
*H01L 21/683* (2006.01)

(52) U.S. Cl.
CPC .............. *B25J 15/06* (2013.01); *B65G 49/061* (2013.01); *H01L 21/6838* (2013.01); *B65G 2249/04* (2013.01); *Y10S 414/141* (2013.01)

(58) Field of Classification Search
CPC ....................................................... B25J 15/06
USPC .................................... 414/627, 806; 294/65
See application file for complete search history.

(56) References Cited

U.S. PATENT DOCUMENTS

| 3,031,906 A * | 5/1962 | Holman ........................ 414/627 |
| 3,223,443 A * | 12/1965 | Misson ........................... 294/65 |
| 3,467,430 A * | 9/1969 | Lowe ............................... 294/65 |
| 4,557,659 A * | 12/1985 | Scaglia ........................ 414/627 |
| 5,823,736 A * | 10/1998 | Matsumura ................... 414/609 |
| 5,975,837 A * | 11/1999 | Focke et al. ..................... 294/65 |
| 6,641,131 B2 * | 11/2003 | Stohr et al. ...................... 271/91 |
| 7,134,833 B2 * | 11/2006 | de Koning ................ 414/753.1 |
| 8,496,425 B2 * | 7/2013 | Lin et al. ....................... 414/729 |

FOREIGN PATENT DOCUMENTS

CN    101712155 A    5/2010

* cited by examiner

*Primary Examiner* — Scott Lowe
(74) *Attorney, Agent, or Firm* — Cheng-Ju Chiang

(57) ABSTRACT

A panel pickup and placing method includes providing a liquid crystal panel, a machine table, a panel pickup device, and a vacuum suction device; coupling the panel pickup device and the vacuum suction device together; moving the panel pickup device to have the vacuum suction device engaging a surface of the liquid crystal panel; the vacuum suction device sucking and adhering to the liquid crystal panel; moving the panel pickup device to have the vacuum suction device lifting the liquid crystal panel for transfer to the machine table; the vacuum suction device releasing the liquid crystal panel; and moving the panel pickup device to have the vacuum suction device departing from the liquid crystal panel in order to position the liquid crystal panel on the machine table. The combined panel pickup device includes a panel pickup device and a vacuum suction device mounted to the panel pickup device.

8 Claims, 4 Drawing Sheets

PANEL PICKUP AND PLACING METHOD AND COMBINED PICKUP DEVICE FOR PERFORMING THE METHOD

BACKGROUND OF THE INVENTION

1. Field of the Invention

The present invention relates to a manufacturing process of liquid crystal panel, and in particular to a panel pickup and placing method for use in a predetermined process and a combined pickup device for performing the method.

2. The Related Arts

Referring to FIG. 1, the currently adopted process for 8.5 generation liquid crystal panel uses the following manufacturing process: (1) a mechanical panel pickup fork 50 positioning a liquid crystal panel 60 transferred from the previous work station on support pins 80 of a machine table 70; (2) the panel pickup fork 50 withdrawing; (3) positioning the liquid crystal panel 60 with positioning rollers (not shown) located around; and (4) electrically charging the liquid crystal panel with a probe (not shown) and carrying out UV (Ultra-Violet) exposure to complete an alignment process of the liquid crystal panel 60.

The support pins 80 are only allowed to locate in a non-display zone 64 of the liquid crystal panel 60. The machine table must be uniform for each individual display zone 66, free of any irregularity and joint, otherwise defects might be caused due to non-uniform exposure and inconsistent temperature occurring in the exposure process.

However, since the liquid crystal panel 60 is positioned on the support pins 80 and since the liquid crystal panel 60 has a size of 2200 mm×2500 mm, but the support pins 80 can only be located in the non-display zone 64 and the number of the support pins 80 is very limited and the liquid crystal panel 60 is large and has a weight exceeding 10 kilograms, when the liquid crystal panel 60 is placed on the support pins 80, significant deformations occur (as shown in FIG. 2), and may even cause breaking. As shown in FIGS. 1 and 3, in manufacturing liquid crystal panels of different sizes (such as 32"-55" liquid crystal panels), the machine table and the support pins must be adjusted in order to prevent poor exposure caused by non-uniformity of the machine table within the display zones. The operation of changing is tedious and may commit fault operations of changing.

SUMMARY OF THE INVENTION

An objective of the present invention is to provide a panel pickup and placing method of a predetermined process, which makes pickup and placing of a panel easy and simplifies a machine table so as to overcome deformation and breaking problems of a glass panel placed on support pins and which makes subsequent operation simple and easy, for no adjustment must be made on the machine table and the locations of the support pins due to inconsistent display zones found in manufacturing products of different sizes, so as to facilitate manufacturing.

Another objective of the present invention is to provide a combined panel pickup device that is used to perform a panel pickup and placing method and has a simple structure, is easy to manufacture, and is easy to carry out panel pickup and placing operations.

To achieve the objective, the present invention provides a panel pickup and placing method of a predetermined process, comprising the following steps:

Step 1: providing a liquid crystal panel, a machine table, a panel pickup device, and a vacuum suction device;

Step 2: coupling the panel pickup device and the vacuum suction device together;

Step 3: moving the panel pickup device to have the vacuum suction engaging a surface of the liquid crystal panel;

Step 4: the vacuum suction device sucking and adhering to the liquid crystal panel;

Step 5: moving the panel pickup device to have the vacuum suction device lifting the liquid crystal panel for transfer to the machine table;

Step 6: the vacuum suction device releasing the liquid crystal panel; and

Step 7: moving the panel pickup device to have the vacuum suction device departing from the liquid crystal panel in order to position the liquid crystal panel on the machine table.

The machine table is a unitary work table.

The panel pickup device comprises a device body and a panel pickup fork mounted to the device body, whereby the panel pickup fork is movable through manipulating the device body. The panel pickup fork comprises a plurality of support sections and a connection section connected to an end of the support sections. The connection section is mounted to the device body.

The vacuum suction device comprises a frame, a plurality of suction nozzles mounted to an undersurface of the frame, and a control system in communication with the suction nozzles through air passages, the control system controlling the suction nozzles to carry out sucking and releasing operations, the suction nozzles functioning to suck and adhere to a liquid crystal panel and being uniformly distributed on the undersurface of the frame.

The liquid crystal panel comprises a display zone and a non-display zone surrounding the display zone. The frame of the vacuum suction device is arranged to correspond in shape to the non-display zone.

In Step 2, the support sections of the panel pickup fork are coupled to the frame of the vacuum suction device by bolts to form a combined panel pickup device.

In Step 3, the device body of the panel pickup device is manipulated to move the panel pickup fork for bringing the vacuum suction device to a location exactly above a surface of the liquid crystal panel and having the suction nozzles respectively engaging the surface of the liquid crystal panel; in Step 4, the suction nozzles are controlled to carry out a sucking and adhering operation to have the suction nozzles adhered to the liquid crystal panel; in Step 5, the device body of the panel pickup device is operated to move the panel pickup fork for bring the vacuum suction device and the liquid crystal panel adhered to the suction nozzles to be above the machine table; in Step 6, the suction nozzles are controlled to carry out a releasing operation to release the suction nozzles from adhering to the liquid crystal panel; and in Step 7, the device body of the panel pickup device is manipulated to move the panel pickup fork for moving the vacuum suction device from the machine table thereby leaving the liquid crystal panel on the machine table.

The present invention also provides a combined panel pickup device comprising a panel pickup device and a vacuum suction device mounted to the panel pickup device.

The panel pickup device comprises a device body and a panel pickup fork mounted to the device body, whereby the panel pickup fork is movable through manipulating the device body. The panel pickup fork comprises a plurality of support sections and a connection section connecting to an end of the support sections, the connection section being mounted to the device body.

The vacuum suction device comprises a frame, a plurality of suction nozzles mounted to an undersurface of the frame, and a control system in communication with the suction nozzles through air passages. The control system controls the suction nozzles to carry out sucking and releasing operations. The suction nozzles function to suck and adhere to a liquid crystal panel and are uniformly distributed on the undersurface of the frame. The support sections of the panel pickup fork are coupled to the frame of the vacuum suction device by bolts.

The efficacy of the present invention is that the present invention provides a panel pickup and placing method of a predetermined process, in which an upper surface of a liquid crystal panel is used to apply a force to suck and hold the liquid crystal panel and the support pins used in the conventional techniques are omitted so that the liquid crystal panel can be directly placed on the machine table and subjected to uniform application of force for protecting the liquid crystal panel from deformation and ensuring the extent of uniformity of UV exposure. And, it is no longer necessary to perform location adjustment of the support pins according to the size of the liquid crystal panel, thereby improving the panel pickup and placing process. Further, the machine table can be made a unitary piece, making it possible to further ensure the uniformity of application of force to the liquid crystal panel. The present invention provides a combined panel pickup device that has a simple structure, is easy to manufacture, and can overcome the technical problems arising in picking and placing panels in the conventional processes.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
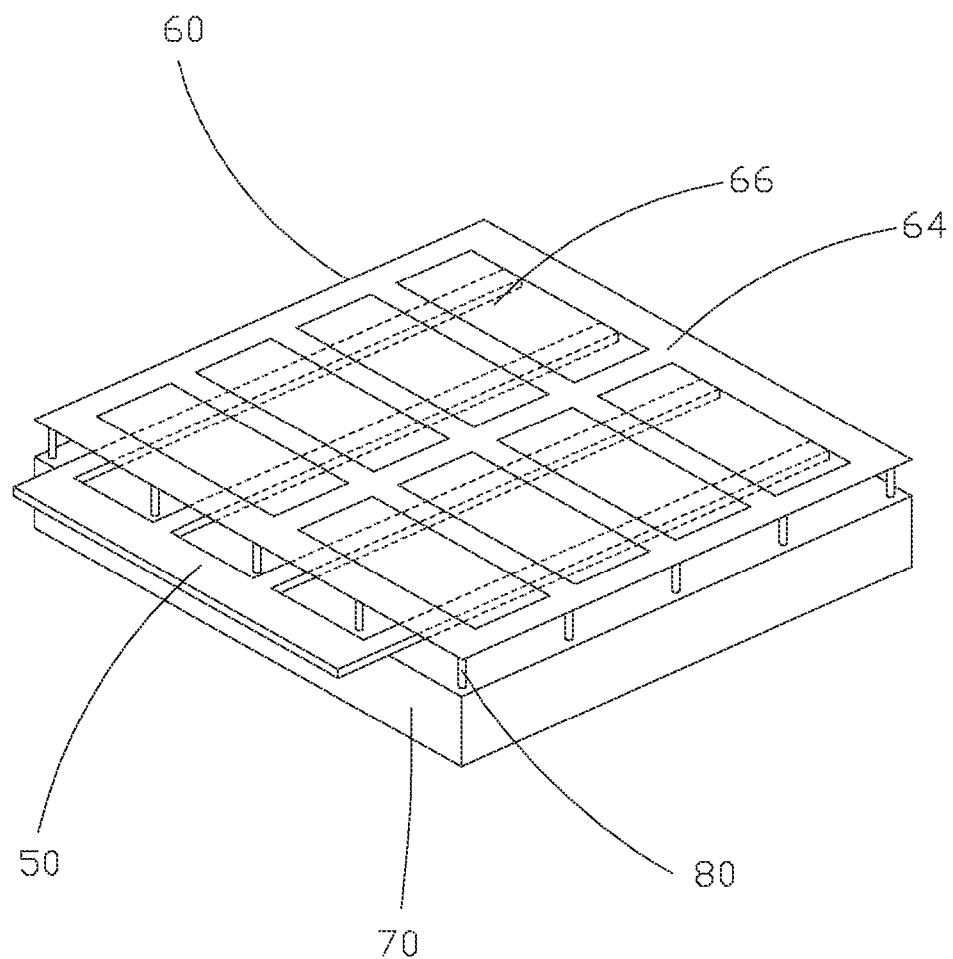
FIG. 1 is a schematic view showing a panel pickup and placing device of a conventional process.
Figure 2:
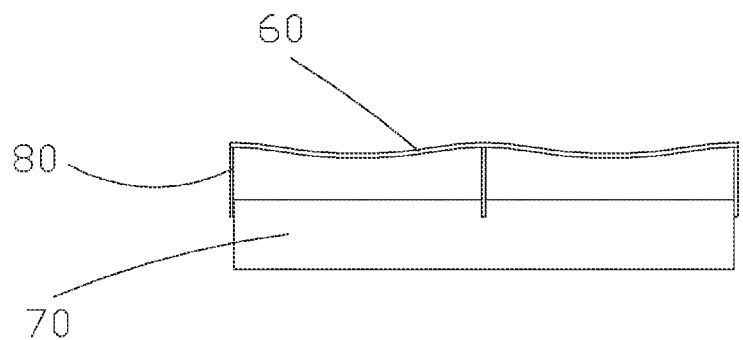
FIG. 2 is a schematic view showing deformation of glass panel in the convention process.
Figure 3:
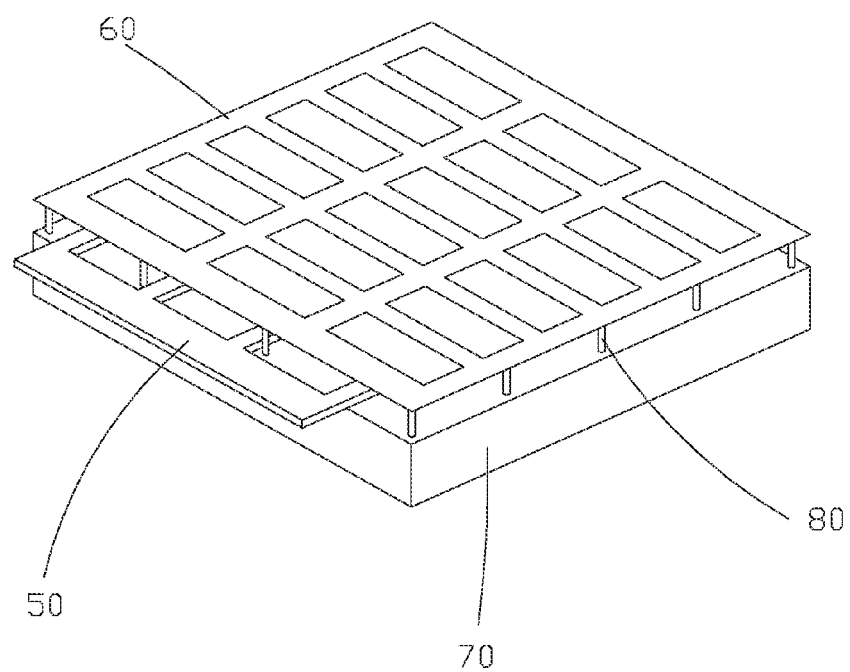
FIG. 3 is schematic view showing panel picking and placing in another process for illustrating liquid crystal panels of different sizes require use different combinations of machine table and support pins.
Figure 4:
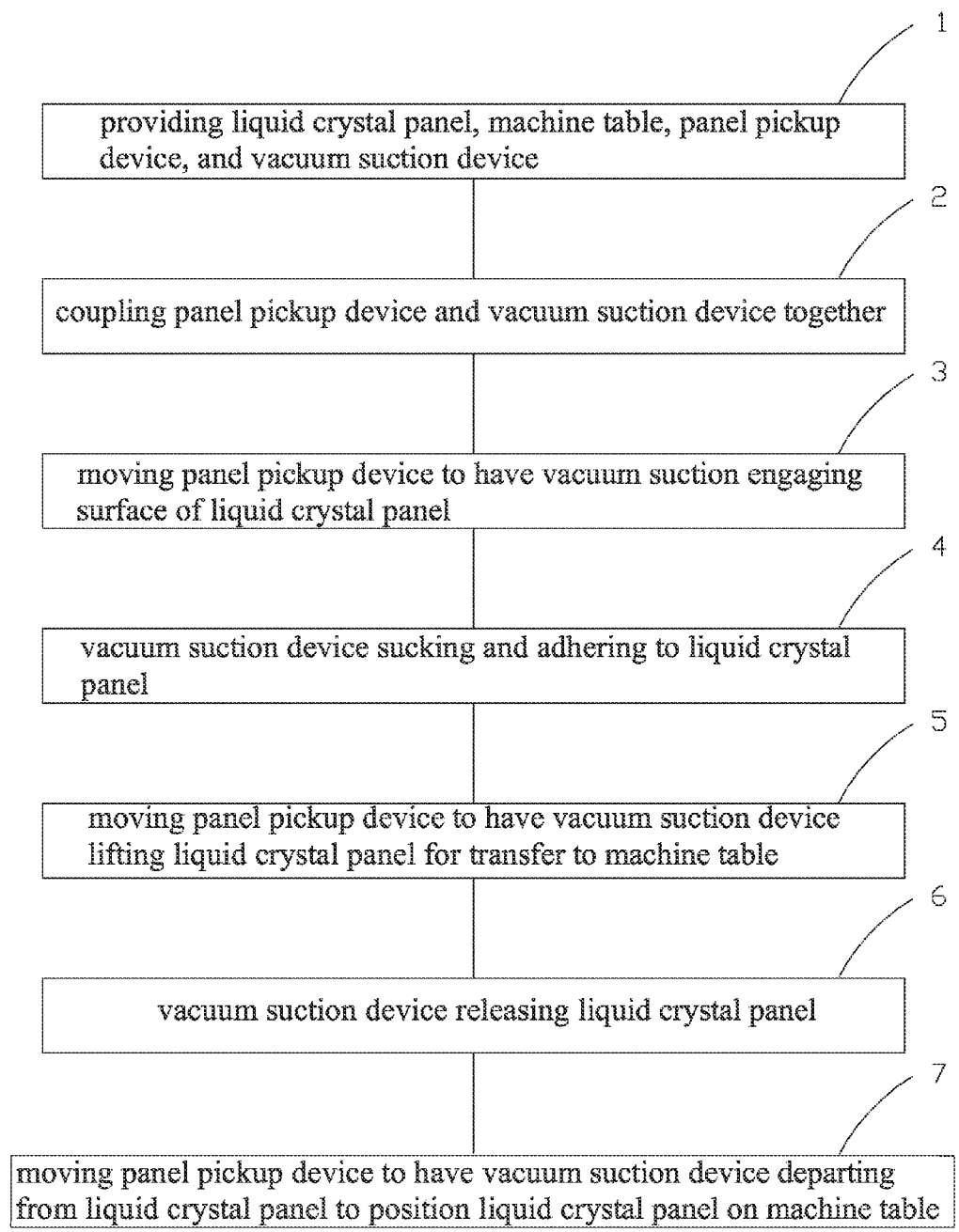
FIG. 4 is a flow chart showing a panel pickup and placing method.

As shown in FIG. 4, the present invention provides a panel pickup and placing method of a predetermined process, which comprises the following steps:

Step 1: providing a liquid crystal panel, a machine table, a panel pickup device, and a vacuum suction device;

Step 2: coupling the panel pickup device and the vacuum suction device together;

Step 3: moving the panel pickup device to have the vacuum suction engaging a surface of the liquid crystal panel;

Step 4: the vacuum suction device sucking and adhering to the liquid crystal panel;

Step 5: moving the panel pickup device to have the vacuum suction device lifting the liquid crystal panel for transfer to the machine table;

Step 6: the vacuum suction device releasing the liquid crystal panel; and

Step 7: moving the panel pickup device to have the vacuum suction device departing from the liquid crystal panel in order to position the liquid crystal panel on the machine table.

Figure 5:
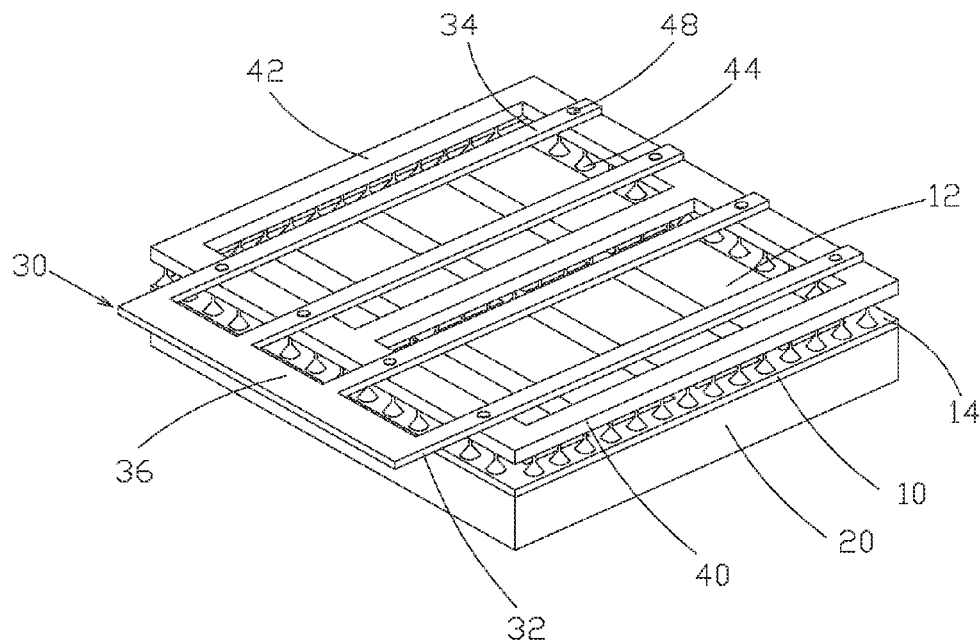
FIG. 5 is a schematic view showing panel picking and placing in a process according to the present invention.

Also referring to FIG. 5, providing a liquid crystal panel 10, a machine table 20, a panel pickup device 30, and a vacuum suction device 40 in Step 1 can all be realized with the known techniques. The machine table 20 can be a unitary work table of a size of 2200×2500 and it is not necessary to arrange the support pins that are required by the known machine table and no adjustment of specification is needed for different liquid crystal panels. The panel pickup device 30 comprises a device body (not shown) and a panel pickup fork 32 mounted on the device body. Through manipulating the device body, the panel pickup fork 32 can be moved. The panel pickup fork 32 comprises a plurality of support sections 34 and a connection section 36 connecting one end of the support sections 34. The connection section 36 is mounted to the device body. The vacuum suction device 40 comprises a frame 42, a plurality of suction nozzles 44 mounted to an underside of the frame 42, and a control system (not shown) in communication with the suction nozzles 44 through air passages (not shown). The control system controls suction and release operations of the suction nozzles 44. The suction nozzles 44 suck and hold a liquid crystal panel 10 and are uniformly distributed on the undersurface of the frame 42. The liquid crystal panel 10 comprises a display zone 12 and a non-display zone 14 that surrounds the display zone 12. The frame 42 of the vacuum suction device 40 is arranged to correspond in shape to the non-display zone 14. In the instant embodiment, the vacuum suction device 40 has a shape of two juxtaposed rectangles.

Figure 6:
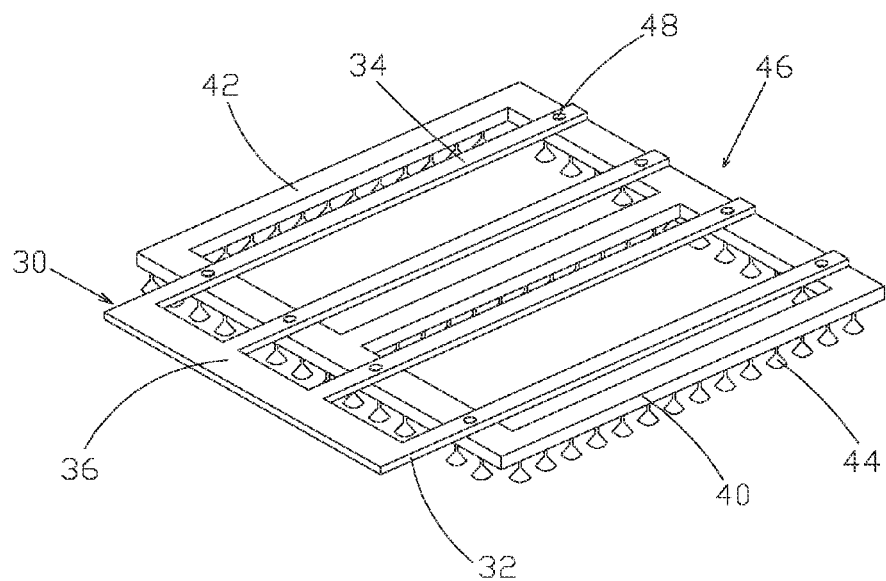
FIG. 6 is a schematic view showing a combined panel pickup device according to the present invention.

Also referring to FIG. 6, In Step 2, the panel pickup device 30 and the vacuum suction device 40 are coupled together to form a combined panel pickup device 46. The coupling between the panel pickup device 30 and the vacuum suction device 40 can be realized with any known techniques. In the instant embodiment, the support sections 34 of the panel pickup fork 32 and the frame 42 of the vacuum suction device 40 are fixed together by bolts 48.

In Step 3, moving the panel pickup device 30 to have the vacuum suction device 40 engaging a surface of the liquid crystal panel 10 can be realized through manipulating a device body of the panel pickup device 30 to move the panel pickup fork 32 so as to bring the vacuum suction device 40 to a location just above the surface of the liquid crystal panel 10 and allow the suction nozzles 44 to respectively engage the surface of the liquid crystal panel 10.

In Step 4, the vacuum suction device sucking and adhering to the liquid crystal panel 10 is realized through any known techniques to control the performance of suction and adherence of the suction nozzles 44 so as to adhere the suction nozzles 44 to the liquid crystal panel 10.

In Step 5, moving the panel pickup device 30 to have the vacuum suction device 40 lifting the liquid crystal panel 10 for transfer to the machine table 20 is realized by manipulating the device body of the panel pickup device 30 to move the panel pickup fork 32 so as to bring the vacuum suction device 40 and the liquid crystal panel 10 adhered to the suction nozzles 44 to the machine table 20.

In Step 6, the vacuum suction device 40 releasing the liquid crystal panel 10 is realized through any known techniques to control the suction nozzles 44 for performing a releasing operation that release the suction of the suction nozzles 44 from the liquid crystal panel 10.

In Step 7, moving the panel pickup device 30 to have the vacuum suction device 40 separating from the liquid crystal panel 10 in order to position the liquid crystal panel 10 on the machine table 20 is realized by manipulating the device body of the panel pickup device 30 to move the panel pickup fork 32 in such a way that the vacuum suction device 40 departs from the machine table 20 and leaves the liquid crystal panel 10 on the machine table 20 for subsequent processing operations.

As shown in FIGS. 5 and 6, the present invention provides a combined panel pickup device 46 for carrying out a panel pickup and placing method, which comprises a panel pickup device 30 and a vacuum suction device 40 mounted to the panel pickup device 30. The panel pickup device 30 and the vacuum suction device 40 can be known techniques. The panel pickup device 30 comprises a device body (not shown) and a panel pickup fork 32 mounted to the device body so that manipulating the device body can move the panel pickup fork 32. The panel pickup fork 32 comprises a plurality of support sections 34 and a connection section 36 connected to an end of each support section 34. The connection section 36 is mounted to the device body. The vacuum suction device 40 comprises a frame 42, a plurality of suction nozzles 44 mounted to an undersurface of the frame 42, and a control system (not shown) in communication with the suction nozzles 44 through air passages (not shown). The suction nozzles 44 are provided to suck and hold a liquid crystal panel 10 and are substantially uniformly distributed on the undersurface of the frame 42. In the instant embodiment, the vacuum suction device 40 is of a shape of two juxtaposed rectangles. In the instant embodiment, the support sections 34 of the panel pickup fork 32 are fixed to the frame 42 of the vacuum suction device 40 by bolts 48.

In summary, the present invention provides a panel pickup and placing method of a predetermined process, in which an upper surface of a liquid crystal panel is used to apply a force to suck and hold the liquid crystal panel and the support pins used in the conventional techniques are omitted so that the liquid crystal panel can be directly placed on the machine table and subjected to uniform application of force for protecting the liquid crystal panel from deformation and ensuring the extent of uniformity of UV exposure. And, it is no longer necessary to perform location adjustment of the support pins according to the size of the liquid crystal panel, thereby improving the panel pickup and placing process. Further, the machine table can be made a unitary piece, making it possible to further ensure the uniformity of application of force to the liquid crystal panel. The present invention provides a combined panel pickup device that has a simple structure, is easy to manufacture, and can overcome the technical problems arising in picking and placing panels in the conventional processes.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A panel pickup and placing method, comprising the following steps:
    Step 1: providing a liquid crystal panel that comprises a display zone and a non-display zone, a machine table, a panel pickup device, and a vacuum suction device that comprises a frame that is configured to correspond to a shape of the non-display zone of the liquid crystal panel and comprising two juxtaposed rectangles that are combined to form a frame configuration having four side frame members connected to each other and a central frame member substantially parallel to two opposite ones of the four side frame members and having two ends connected to the other two opposite ones of the four side frame members and a plurality of suction nozzles mounted to an undersurface of each of the four side frame members and the central frame member of the frame so as to achieve uniform application of force to the liquid crystal panel, wherein the panel pickup device comprises a device body and a panel pickup fork mounted to the device body, the panel pickup fork comprising a plurality of support sections and a connection section connecting to an end of the support sections, the connection section being mounted to the device body, the supporting sections being fixed to the frame of the vacuum suction device and substantially parallel to the central frame member of the frame;
    Step 2: coupling the panel pickup device and the vacuum suction device together;
    Step 3: moving the panel pickup device to have the vacuum suction device engaging a surface of the liquid crystal panel;
    Step 4: the vacuum suction device sucking and adhering to the liquid crystal panel;
    Step 5: moving the panel pickup device to have the vacuum suction device lifting the liquid crystal panel for transfer to the machine table;
    Step 6: the vacuum suction device releasing the liquid crystal panel; and
    Step 7: moving the panel pickup device to have the vacuum suction device departing from the liquid crystal panel in order to position the liquid crystal panel on the machine table.

2. The panel pickup and placing method as claimed in claim 1, wherein the machine table is a unitary work table.

3. The panel pickup and placing method as claimed in claim 1, wherein the vacuum suction device comprises a control system in communication with the suction nozzles through air passages, the control system controlling the suction nozzles to carry out sucking and releasing operations, the suction nozzles functioning to suck and adhere to a liquid crystal panel and being uniformly distributed on the undersurface of the frame.

4. The panel pickup and placing method as claimed in claim 3, wherein the non-display zone of the liquid crystal panel is arranged to surround the display zone.

5. The panel pickup and placing method as claimed in claim 3, wherein in Step 2, the support sections of the panel pickup fork are coupled to the frame of the vacuum suction device by bolts to form a combined panel pickup device.

6. The panel pickup and placing method as claimed in claim 3, wherein in Step 3, the device body of the panel pickup device is manipulated to move the panel pickup fork for bringing the vacuum suction device to a location exactly above a surface of the liquid crystal panel and having the suction nozzles respectively engaging the surface of the liquid crystal panel; in Step 4, the suction nozzles are controlled to carry out a sucking and adhering operation to have the suction nozzles adhered to the liquid crystal panel; in Step 5, the device body of the panel pickup device is operated to move the panel pickup fork for bring the vacuum suction device and the liquid crystal panel adhered to the suction nozzles to be above the machine table; in Step 6, the suction nozzles are controlled to carry out a releasing operation to release the suction nozzles from adhering to the liquid crystal panel; and in Step 7, the device body of the panel pickup device is manipulated to move the panel pickup fork for moving the vacuum suction device from the machine table thereby leaving the liquid crystal panel on the machine table.

7. A combined panel pickup device comprising a panel pickup device and a vacuum suction device mounted to the panel pickup device for picking up a liquid crystal panel, the vacuum suction device comprising a frame that is configured to correspond to a shape of a non-display zone of the liquid crystal panel and comprising two juxtaposed rectangles that are combined to form a frame configuration having four side frame members connected to each other and a central frame member substantially parallel to two opposite ones of the four side frame members and having two ends connected to the other two opposite ones of the four side frame members and a plurality of suction nozzles mounted to an undersurface of each of the four side frame members and the central frame member of the frame so as to achieve uniform application of force to the liquid crystal panel, wherein the panel pickup device comprises a device body and a panel pickup fork mounted to the device body, the panel pickup fork comprising a plurality of support sections and a connection section connecting to an end of the support sections, the connection section being mounted to the device body, the supporting sections being fixed to the frame of the vacuum suction device and substantially parallel to the central frame member of the frame.

8. The combined panel pickup device as claimed in claim 7, wherein the vacuum suction device comprises a control system in communication with the suction nozzles through air passages, the control system controlling the suction nozzles to carry out sucking and releasing operations, the suction nozzles functioning to suck and adhere to a liquid crystal panel for picking up the liquid crystal panel and being uniformly distributed on the undersurface of the frame, the support sections of the panel pickup fork being coupled to the frame of the vacuum suction device by bolts.

* * * * *